(12) United States Patent
Kim

(10) Patent No.: US 7,595,254 B2
(45) Date of Patent: Sep. 29, 2009

(54) METHOD OF MANUFACTURING A SEMICONDUCTOR DEVICE

(75) Inventor: Byung Ho Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 162 days.

(21) Appl. No.: 11/614,630

(22) Filed: Dec. 21, 2006

(65) Prior Publication Data

US 2007/0148902 A1 Jun. 28, 2007

(30) Foreign Application Priority Data

Dec. 28, 2005 (KR) ............ 10-2005-0132012

(51) Int. Cl.
H01L 21/76 (2006.01)
(52) U.S. Cl. .............. 438/427; 438/424; 438/637; 438/700; 438/E21.545
(58) Field of Classification Search ......... 438/424–427, 438/637–638, 672–673, 700
See application file for complete search history.

(56) References Cited

U.S. PATENT DOCUMENTS 5,994,237 A * 11/1999 Becker et al. ............ 438/734
7,176,138 B2 * 2/2007 Chen et al. ............... 438/700
2001/0038111 A1* 11/2001 DeBoer et al. ............ 257/300
2002/0115270 A1* 8/2002 Wu ........................ 438/484
2004/0043542 A1* 3/2004 Park et al. ................ 438/142
2006/0237817 A1* 10/2006 Park ....................... 257/500

FOREIGN PATENT DOCUMENTS

KR 1020050014165 A 2/2005
KR 1020050022438 A 3/2005

* cited by examiner

Primary Examiner—Dung A. Le

(57) ABSTRACT

Embodiments relate to a method for manufacturing a semiconductor device, which may reduce damage due to stress of an STI bottom corner during an ion implantation and annealing being subsequent process of an STI in a semiconductor process are provided. According to embodiments, a method may include forming a prescribed insulating layer on a substrate, forming a photoresist pattern defining a trench region on the insulating layer, dry-etching the insulating layer and the substrate using the photoresist pattern as a mask to form a first trench region, and wet-etching the substrate on which the first trench region is formed using the photoresist pattern as a mask to form a second trench region.

9 Claims, 2 Drawing Sheets

METHOD OF MANUFACTURING A SEMICONDUCTOR DEVICE

The present application claims priority under 35 U.S.C. 119 and 35 U.S.C. 365 to Korean Patent Application No. 10-2005-0132012 (filed on Dec. 28, 2005), which is hereby incorporated by reference in its entirety.

BACKGROUND

FIG. 1 is an example cross-sectional diagram illustrating a semiconductor device according to the related art.

Referring to FIG. 1, substrate 1 may be thermally oxidized to thermally grow pad oxide layer 2. Silicon substrate 1 may be etched to a prescribed depth to form trench 6 at a device isolation region. An oxide layer may be formed at trench 6 to obtain a shallow trench isolation ("STI") structure.

However, in the related art, a bottom edge of an STI may be subjected to large amounts of stress during an ion implantation and high temperature annealing, which may be subsequent processes. In particular, an ion implantation may be performed using elements such as arsenic As, which may have a relatively large size. During ion implantation, a failure may occur. For example, a failure such as a fracture and/or hole 8 may occur. This may reduce a yield of semiconductor devices during manufacturing. Hole 8 may indicate a tearing of a substrate due to significant stress.

SUMMARY OF THE INVENTION

Embodiments relate to a semiconductor device and a method for manufacturing the same.

Embodiments relate to a semiconductor device and a method for manufacturing the same, which may reduce the damage due to a stress of an STI bottom corner during an ion implantation and annealing, which may be a subsequent process of an STI in a semiconductor process.

In embodiments, a method for manufacturing a semiconductor device may include forming a prescribed insulating layer on a substrate, forming a photoresist pattern defining a trench region on the insulating layer, dry-etching the insulating layer and the substrate using the photoresist pattern as a mask to form a first trench region, and wet-etching the substrate on which the first trench region may be formed using the photoresist pattern as a mask to form a second trench region.

In embodiments, a semiconductor device may include a shallow trench isolation structure, wherein a bottom corner region of the trench structure may be rounded, and may not form an angle.

DETAILED DESCRIPTION OF EMBODIMENTS

FIG. 2A through 2E are example cross-sectional diagrams illustrating a semiconductor device and a method for manufacturing the same according to embodiments.

Figure 1:
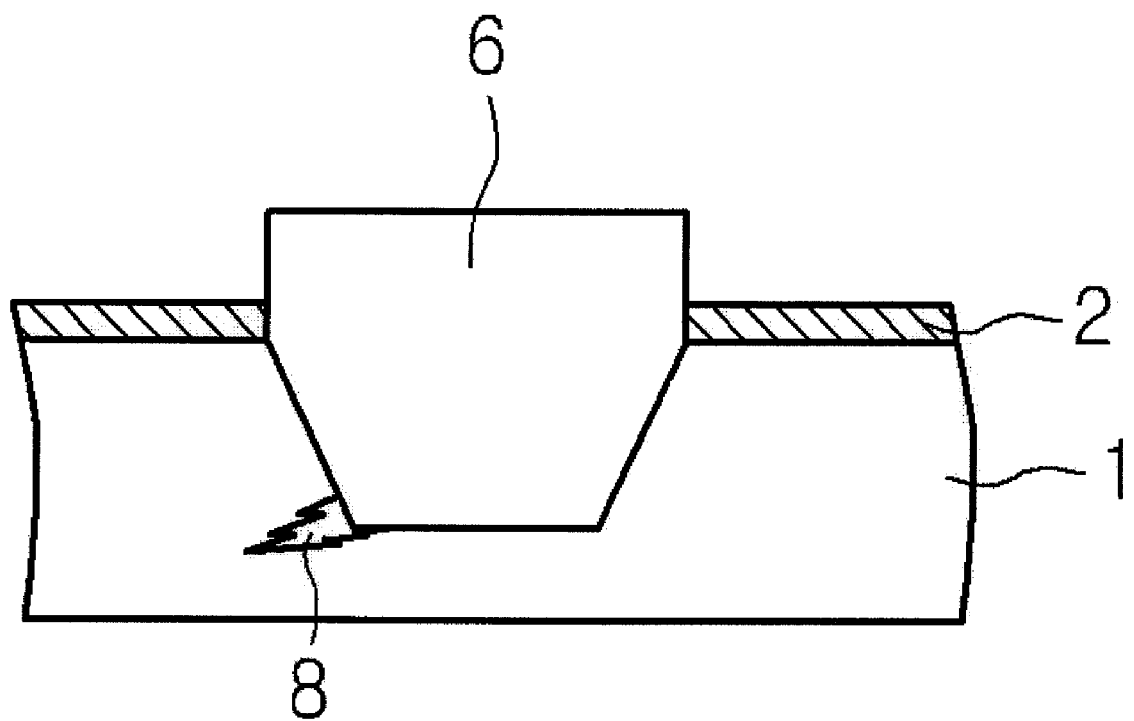
FIG. 1 is an example cross-sectional diagram illustrating a semiconductor device according to the related art.
Figure 2:
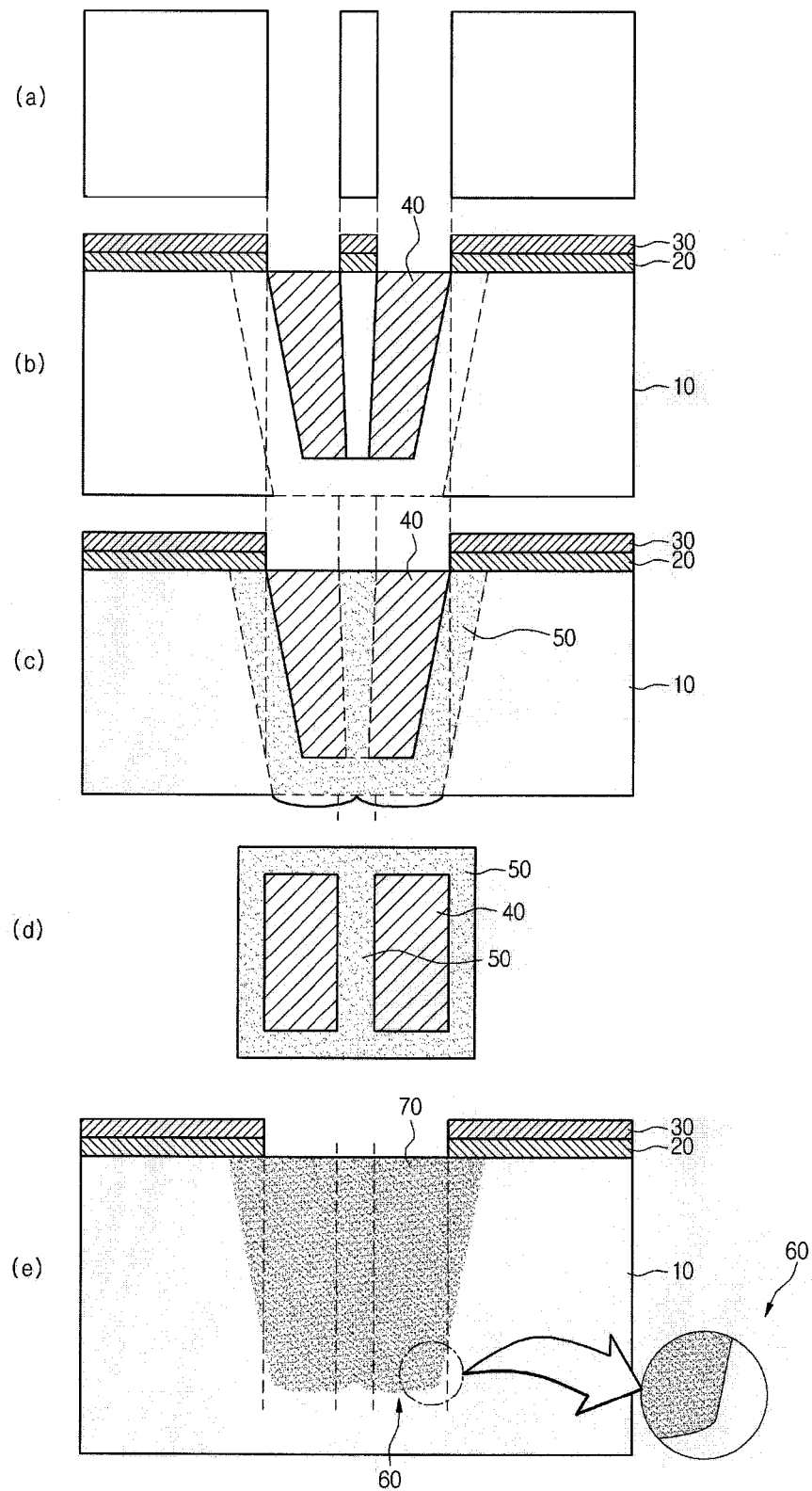
FIGS. 2A through 2E are example cross-sectional diagrams illustrating a semiconductor device and a method for manufacturing a semiconductor device according to embodiments.

FIG. 2A is a diagram illustrating a photoresist pattern that may be used to form a trench on a substrate coated with a photoresist layer. According to embodiments, the trench may be formed by exposing and developing a photoresist layer through a mask (not shown) on which a trench pattern having a etch rate less than that of a destination trench pattern may be formed.

Substrate 10 may be thermally oxidized and may thermally grow pad oxide layer 20. Nitride layer 30 may be formed on pad oxide layer 20, and a photoresist layer may be coated on nitride layer 30.

The photoresist layer may be exposed and developed through a mask on which a trench pattern having an etch rate less than that of a destination trench may be formed. Photoresist layer pattern (FIG. 2A) for forming a trench may thus be formed.

In embodiments, a trench pattern mask may be used which may have an etch rate of 7~15% less than that of a destination trench pattern to be formed. This may be to compensate for the event that an STI region may be enlarged during a wet etch being a subsequent process. According to embodiments, a mask on which a trench pattern may be formed may have a size of approximately 10% less than that of the destination trench pattern. In embodiments, the percentage may be 7 to 15%.

Moreover, the mask on which the trench pattern may be formed may further be formed to have a mask pattern to remain a center part of a dry-etched substrate. Hence, a portion of the insulating layer serving as a mask may remain a center of the trench region. This may effectively form a rounding at a corner part of an STI during a subsequent wet etching process. In embodiments, a bottom corner of the shallow trench may be substantially rounded.

Referring to FIG. 2B, nitride layer 30 and pad oxide layer 20 may be sequentially dry-etched, for example using the photoresist pattern (FIG. 2A) as a mask. This may form insulating layer patterns 20 and 30 which may be used to form a trench. Further, using insulating layer patterns 20 and 30 as a mask, substrate 10 may be dry-etched to a prescribed depth to form trench region 40. Since an anisotropic etch may be performed in a dry etch more easily than a wet etch, as shown in FIG. 2B, it may be possible to form an exact trench.

FIG. 2B shows an example first trench region 40, which may be etched to be smaller than a size of second trench region 70. Second trench region may be a destination trench region. The size differential may be caused by using a mask on which a trench pattern smaller than the second trench region 70 is formed.

In addition, since a mask pattern may be formed as illustrated in FIG. 2A, and may be positioned at a center of a surface of the substrate to dry-etch insulating layer patterns 20 and 30, first trench region 40 may be formed substantially at a center part of insulating layer 20 and 30 by a dry etch. The first trench region 40 may function to form a rounding at a corner part of the STI during a subsequent wet etch.

According to embodiments, the initial trench mask pattern may be formed at a center part of the substrate. However, embodiments may be not limited thereto. In embodiments, the pattern may be formed to perform dry-etching of insulating layer patterns 20 and 30 at portions other than a center part of a surface of the substrate.

In embodiments, $CBrF_3$ or $CF_4$ may be used to etch nitride layer 30. In embodiments, $CF_4$ or $C_2F_2$ may be used to etch pad oxide layer 20. In embodiments, $CF_4$, $SiF_4$, or $Cl_2/Ar$ may be used to etch the substrate. In embodiments, other etch substances may be used.

Referring to FIG. 2C, a wet etching may be performed. FIG. 2C illustrates an example result of wet-etching the substrate, for example by using insulating patterns 20 and 30 as a mask.

Second trench region 70 may be formed. In embodiments, second trench region 70 may be a destination trench pattern, and may be formed by performing wet etching 50 through a mask on which a trench pattern having a rate less than that of second trench region 70 may be formed. The wet etching may be performed using an isotropic etching characteristic of a wet etch, in embodiments, and may form rounding 60 at a bottom corner part of the STI.

In the wet etch of substrate 10 according to embodiments, the wet etch may be performed in a water solution that may contain $HNO_3$ and $HF$ as an oxidizer and may contain $CH_3COOH$ or $Br_2$ as additives.

FIG. 2D is an example plan view of second trench region 70, which may be a final trench pattern formed after both dry etch 40 and the wet etch 50 have been performed.

FIG. 2E is an example view illustrating a result of rounding 60 formed at a bottom part of the STI, according to embodiments. Since a lower part of second trench region 70 may have a substantially rounded shape which is not a corner shape, stress that may be caused by a bottom corner part of a trench may be prevented during an ion implantation and a high temperature annealing, each of which may be subsequent processes after the formation of the STI. This may prevent a failure from occurring, such as fractures and/or hole formations in the substrate.

Second trench region 70 may then be filled, for example with an insulating layer.

According to embodiments, in the STI etch, after a dry etch, a wet etch may be performed to round a bottom corner part of the STI. This may prevent a failure, for example having a hole shape, that may be caused by stress of a bottom corner of the STI during subsequent ion implantation and high temperature annealing processes of the STI etching process.

In addition, embodiments may prevent a failure due to a stress of a bottom corner part of the STI from occurring, which may increase a yield during manufacture of a semiconductor device.

It will be apparent to those skilled in the art that various modifications and variations may be made to embodiments. Thus, it may be intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method comprising:
   forming an insulating layer over a substrate;
   forming a photoresist pattern to define a trench region over the insulating layer;
   dry-etching the insulating layer and the substrate using the photoresist pattern as a mask to form a first trench region; and
   wet-etching the substrate at the first trench region using the photoresist pattern as a mask to form a second trench region, wherein the second trench region has a size that is greater than a size of the first trench region, wherein the photoresist pattern is formed in a prescribed shape, and configured to remain at a center part of a surface of the insulating layer, the insulating layer remaining over a center portion of the first trench region, such that a center portion is not dry etched.

2. The method of claim 1, wherein the second trench region has bottom corners that are substantially rounded.

3. The method of claim 2, further comprising filling the second trench region with a trench insulating material.

4. The method of claim 3, further comprising performing an ion implantation process on semiconductor substrate, including the second trench region.

5. The method of claim 1, wherein the insulating layer comprises a pad oxide layer and a nitride layer.

6. The method of claim 1, wherein the second trench region has a size that is approximately 7-15% greater than a size of the first trench region.

7. The method of claim 1, wherein the first trench region comprises a first portion and a second portion formed on opposite sides of a remaining portion of substrate, the remaining portion of substrate being directly below the portion of the insulating layer remaining over the center portion of the first trench region.

8. The method of claim 1, wherein the photoresist pattern is formed in a prescribed shape not to remain a center part of the trench region.

9. The method of claim 1, wherein the photoresist pattern forms a mask that is smaller than a size of the second trench region.

* * * * *